United States Patent
Lin et al.

(10) Patent No.: US 10,170,468 B1
(45) Date of Patent: Jan. 1, 2019

(54) SEMICONDUCTOR STRUCTURE AND METHOD OF MANUFACTURING THE SAME

(71) Applicant: Vanguard International Semiconductor Corporation, Hsinchu (TW)

(72) Inventors: Wen-Hsin Lin, Jhubei (TW); Shin-Cheng Lin, Tainan (TW); Cheng-Tsung Wu, Taipei (TW); Yu-Hao Ho, Keelung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/635,686

(22) Filed: Jun. 28, 2017

(51) Int. Cl.
| | |
|---|---|
| H01L 29/66 | (2006.01) |
| H01L 21/74 | (2006.01) |
| H01L 29/10 | (2006.01) |
| H01L 29/78 | (2006.01) |
| H01L 27/07 | (2006.01) |
| H01L 29/808 | (2006.01) |
| H01L 29/861 | (2006.01) |

(52) U.S. Cl.
CPC .......... *H01L 27/0727* (2013.01); *H01L 21/74* (2013.01); *H01L 29/1075* (2013.01); *H01L 29/66136* (2013.01); *H01L 29/66901* (2013.01); *H01L 29/808* (2013.01); *H01L 29/861* (2013.01)

(58) Field of Classification Search
CPC ............... H01L 27/0727; H01L 21/74; H01L 29/66136; H01L 29/66901; H01L 29/861; H01L 29/808; H01L 29/1075

USPC ......................................................... 275/272
See application file for complete search history.

(56) References Cited

U.S. PATENT DOCUMENTS

| | | | |
|---|---|---|---|
| 2010/0109081 A1 | 5/2010 | Chen et al. | |
| 2011/0156810 A1 | 6/2011 | Girdhar et al. | |
| 2014/0264581 A1 | 9/2014 | Chan et al. | |
| 2014/0339635 A1 | 11/2014 | Komatsu et al. | |
| 2015/0115367 A1* | 4/2015 | Lin | H01L 27/0928 257/369 |
| 2015/0243766 A1* | 8/2015 | Tu | H01L 29/66681 257/329 |
| 2015/0243770 A1 | 8/2015 | Hebert et al. | |

(Continued)

OTHER PUBLICATIONS

Office Action issued in corresponding Taiwan application No. 106113884 dated May 31, 2018.

*Primary Examiner* — Caleen Sullivan
(74) *Attorney, Agent, or Firm* — Birch, Stewart, Kolasch & Birch, LLP

(57) ABSTRACT

A semiconductor structure is provided. A semiconductor substrate has a first conductivity type. A first well is formed in the semiconductor substrate and has a second conductivity type. A first well includes a first region and a second region. The dopant concentration of the first region is higher than the dopant concentration of the second region. A second well has the first conductivity type and is formed in the first region. A first doped region is formed in the first region and has the second conductivity type different than the first conductivity type. The second doped region has the first conductivity type and is formed in the second well. A third doped region has the first conductivity type and is formed in the second region. A fourth doped region has the second conductivity type and is formed in the first region.

20 Claims, 7 Drawing Sheets

(56) References Cited

U.S. PATENT DOCUMENTS

2016/0284801 A1  9/2016 Mori
2017/0092755 A1* 3/2017 Tu .................... H01L 29/66681

* cited by examiner

SEMICONDUCTOR STRUCTURE AND METHOD OF MANUFACTURING THE SAME

BACKGROUND OF THE INVENTION

Field of the Invention

The invention relates to a semiconductor structure, and more particularly to a semiconductor structure that comprises a PN junction.

Description of the Related Art

Transistors are classed into two categories: bipolar junction transistors (BJTs) and field effect transistors (FETs). Since the structure of a FET is simpler than the structure of a BJT, FETs are used more often. FETs can be classified into two groups: metal oxide semiconductor FETs (MOSFETs) and junction FETs (JFETs). However, a JFET provides only a small amount of current. To provide a large current, the size of the JFET must be increased to such a degree that the cost of the elements increases.

BRIEF SUMMARY OF THE INVENTION

In accordance with an embodiment, a semiconductor structure comprises a semiconductor substrate, a first well, a second well, a first doped region, a second doped region, a third doped region and a fourth doped region. The semiconductor substrate has a first conductivity type. The first well is formed in the semiconductor substrate and has a second conductivity type. The first well comprises a first region and a second region. The dopant concentration of the first region is higher than the dopant concentration of the second region. The second well has the first conductivity type and is formed in the first region. The first doped region has the second conductivity type and is formed in the first region. The second conductivity type is different than the first conductivity type. The second doped region has the first conductivity type and is formed in the second well. The third doped region has the first conductivity type and is formed in the second region. The fourth doped region has the second conductivity type and is formed in the first region.

An exemplary embodiment of a method for manufacturing a semiconductor structure is described in the following paragraph. A semiconductor substrate is provided. The semiconductor substrate has a first conductivity type. A first well is formed in the semiconductor substrate. The first well has a second conductivity type. A first region is formed in the first well. The first region has the first conductivity type. A second region is formed in the first well. The second region has the first conductivity type. The dopant concentration of the first region is higher than the dopant concentration of the second region. A second well is forming in the first region. The second well has the first conductivity type. A first doped region is formed in the first region. The first doped region has the second conductivity type that is different than the first conductivity type. A second doped region is formed in the second well. The second doped region has the first conductivity type. A third doped region is formed in the second region. The third doped region has the first conductivity type. A fourth doped region is formed in the first region. The fourth doped region has the second conductivity type.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
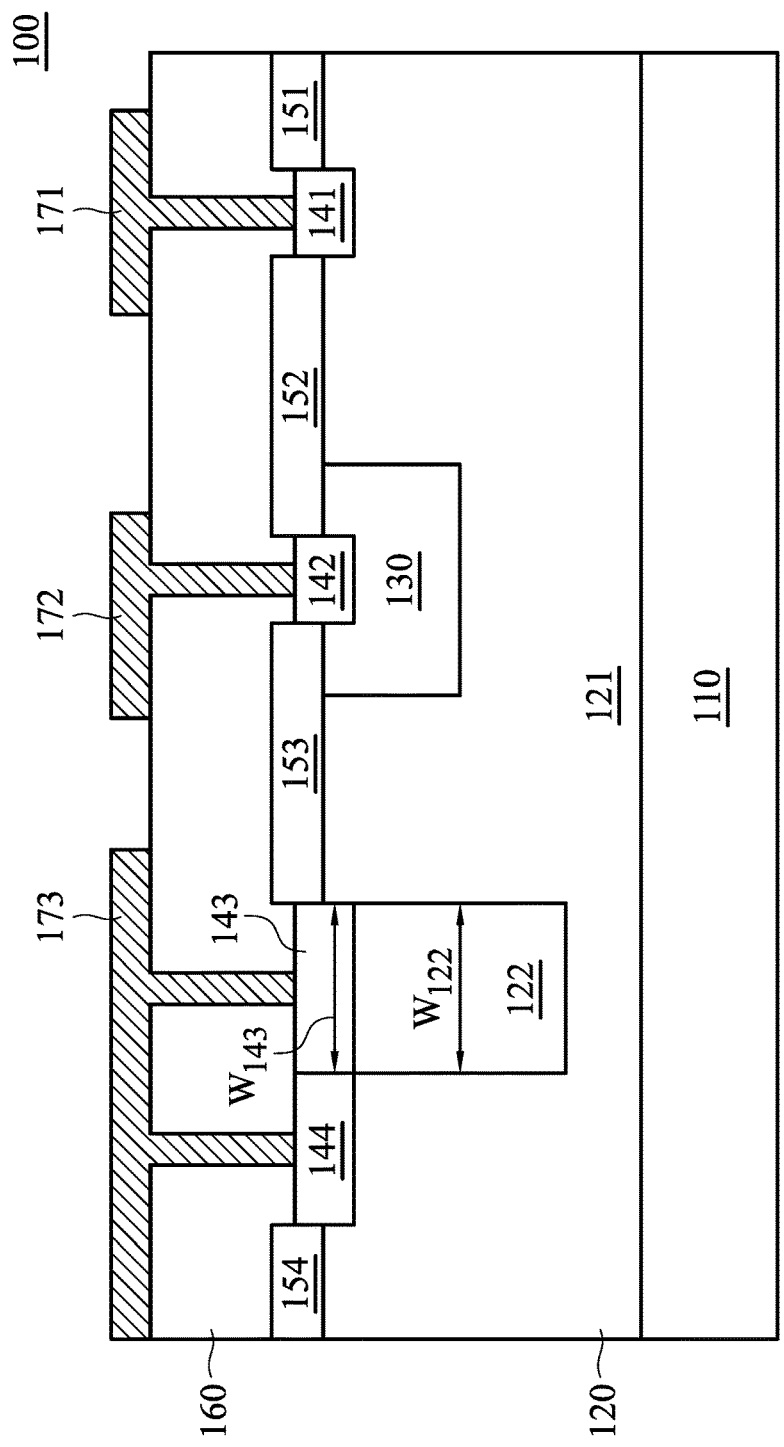
FIG. 1 is a schematic diagram of an exemplary embodiment of a semiconductor device, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

FIG. 1 is a schematic diagram of an exemplary embodiment of a semiconductor device, according to various aspects of the present disclosure. The semiconductor device 100 comprises a semiconductor substrate 110, wells 120 and 130, and doped regions 141~144. The semiconductor substrate 110 has a first conductivity type. In one embodiment, the substrate 110 may be a silicon substrate or another suitable semiconductor substrate. In other embodiments, the semiconductor substrate 110 may be a lightly doped substrate such as a lightly doped P-type substrate or a lightly doped N-type substrate.

The well 120 is formed in the semiconductor substrate 110 and has a second conductivity type. The second conductivity type is different from the first conductivity type. In one embodiment, the first conductivity type is P-type, and the second conductivity type is N-type. In another embodiment, the first conductivity type is N-type, and the second conductivity type is P-type. In other embodiments, the well 120 may be formed by ion implantation. For example, when the second conductivity type is N-type, the predetermined region for the well 120 may be implanted with phosphorous ions or arsenic ions to form the well 120. However, when the second conductivity type is P-type, the predetermined region for the well 120 may be implanted with boron ions or indium ions to form the well 120. In some embodiments, the well 120 is a high-voltage well.

In this embodiment, the well 120 comprises regions 121 and 122. The concentration of the dopants in the region 121 is higher than the concentration of the dopants in the region 122. As shown in FIG. 1, the region 122 is formed in the region 121. In the present disclosure, the method for forming the region 122 is not limited. In one embodiment, a doping process is executed for the region 121. In this case, no dopant is doped in the region 122. Although no dopant is doped in the region 122, the dopants doped in the region 121 may be diffused toward the side of the region 122. Therefore, the region 122 has the dopants. The conductivity type of the dopants in the region 122 is the same as the conductivity type of the dopants in the region 121. In one embodiment, the conductivity type of the dopant in the region 122 may be the second conductivity type. However, the concentration of the dopants in the region 122 is lower than the concentration of the dopants in the region 121. In another embodiment, a first doping process is performed for the region 121, and a second doping process is performed for the region 122, wherein the concentration of the dopants doped into the region 121 is higher than the concentration of the dopants doped into the region 122. Therefore, the dopant concentration of the region 121 is higher than the dopant concentration of the region 122.

The well 130 is formed in the region 121 and has the first conductivity type. In one embodiment, the well 130 is formed by ion implantation. For example, when the first conductivity type is N-type, the predetermined region for the well 130 may be implanted with phosphorous ions or arsenic ions to form the well 130. However, when the first conductivity type is P-type, the predetermined region for the well 130 may be implanted with boron ions or indium ions to form the well 130. In this embodiment, the dopant concentration of the well 130 is higher than the dopant concentration of the semiconductor substrate 110.

The doped region 141 is formed in the region 121 and has the second conductivity type. In one embodiment, the dopant concentration of the doped region 141 is higher than the dopant concentration of the region 121. The doped region 142 is formed in the well 130 and has the first conductivity type. In one embodiment, the dopant concentration of the doped region 142 is higher than the dopant concentration of the well 130. In this embodiment, the doped region 142 is disposed between the doped regions 141 and 143.

The doped region 143 has the first conductivity type and is formed in the region 122. In this embodiment, the doped region 143 is disposed between the doped regions 142 and 144. In one embodiment, the dopant concentration of the doped region 143 is higher than the dopant concentration of the well 130. In another embodiment, the dopant concentration of the doped region 143 is about equal to the dopant concentration of the doped region 142. In this embodiment, the width $W_{143}$ of the doped region 143 is substantially equal to the width $W_{122}$ of the region 122. Therefore, the doped region 143 completely covers the region 122, but the disclosure is not limited thereto. In other embodiments, the width $W_{143}$ of the doped region 143 may be more than or less than the width $W_{122}$ of the region 122. In this embodiment, since the conductivity type of the doped region 143 is different from the conductivity type of the region 122, a PN junction occurs between the doped region 143 and the region 122. In one embodiment, the conductivity type of the doped region 143 is P-type, and the conductivity type of the region 122 is N-type. In another embodiment, the conductivity type of the doped region 143 is N-type, and the conductivity type of the region 122 is P-type.

The doped region 144 has the second conductivity type and is formed in the region 121. In one embodiment, the dopant concentration of the doped region 144 is higher than the dopant concentration of the region 121. In another embodiment, the dopant concentration of the doped region 144 is about equal to the dopant concentration of the doped region 141. Furthermore, in this embodiment, the doped region 144 directly contacts the doped region 143, but the disclosure is not limited thereto. In other embodiments, the doped region 144 is spaced apart from the doped region 143.

In one embodiment, the semiconductor device 100 further comprises insulating structures 151~154. The insulating structure 151 contacts the doped region 141, but the disclosure is not limited thereto. In other embodiments, the insulating structure 151 is spaced apart from the doped region 141. The insulating structure 152 is disposed between the doped regions 141 and 142 to isolate the doped regions 141 and 142. As shown in FIG. 1, the insulating structure 152 is in direct contact with the doped regions 141 and 142, but the disclosure is not limited thereto. In other embodiments, the insulating structure 152 does not contact the doped region 141 and/or the doped region 142.

The insulating structure 153 is disposed between the doped regions 142 and 143 to isolate the doped regions 142 and 143. As shown in FIG. 1, the insulating structure 153 is in direct contact with the doped regions 142 and 143, but the disclosure is not limited thereto. In some embodiments, the insulating structure 153 does not contact the doped region 142 and/or the doped region 143. The insulating structure 154 contacts the doped region 144, but the disclosure is not limited thereto. In other embodiments, the insulating structure 154 is spaced apart from the doped region 144.

In some embodiments, the semiconductor device 100 further comprises an insulating layer 160 and interconnection structures 171~173. The insulating layer 160 is formed on the semiconductor substrate 110 and covers the insulating structures 151~154 and the doped regions 141~144. In this embodiment, the interconnection structure 171 is electrically connected to the doped region 141 to serve as a source electrode. The interconnection structure 172 is electrically connected to the doped region 142 to serve as a gate electrode. The interconnection structure 173 is electrically connected to the doped regions 143 and 144 to serve as a drain electrode.

In this embodiment, the semiconductor device 100 provides a junction field effect transistor (JFET). The interconnection structure 172 serves as the gate electrode of the JFET. The interconnection structure 171 serves as the source electrode of the JFET. The interconnection structure 173 serves as the drain electrode of the JFET. When the interconnection structure 173 transmits a drain voltage to the doped regions 143 and 144, since the dopant concentration of the region 122 is low, an equivalent diode occurring between the doped region 143 and the region 122 is forward turned on. Therefore, the semiconductor device 100 provides a large current. Furthermore, the width $W_{122}$ of the region 122 relates to the time at which the PN junction between the doped region 143 and the region 122 is turned on. Therefore, the time at which the PN junction between the doped region 143 and the region 122 is turned on is adjusted according to the width $W_{122}$ of the region 122. In one embodiment, the width $W_{122}$ of the region 122 is within 0~20 um.

Figure 2:
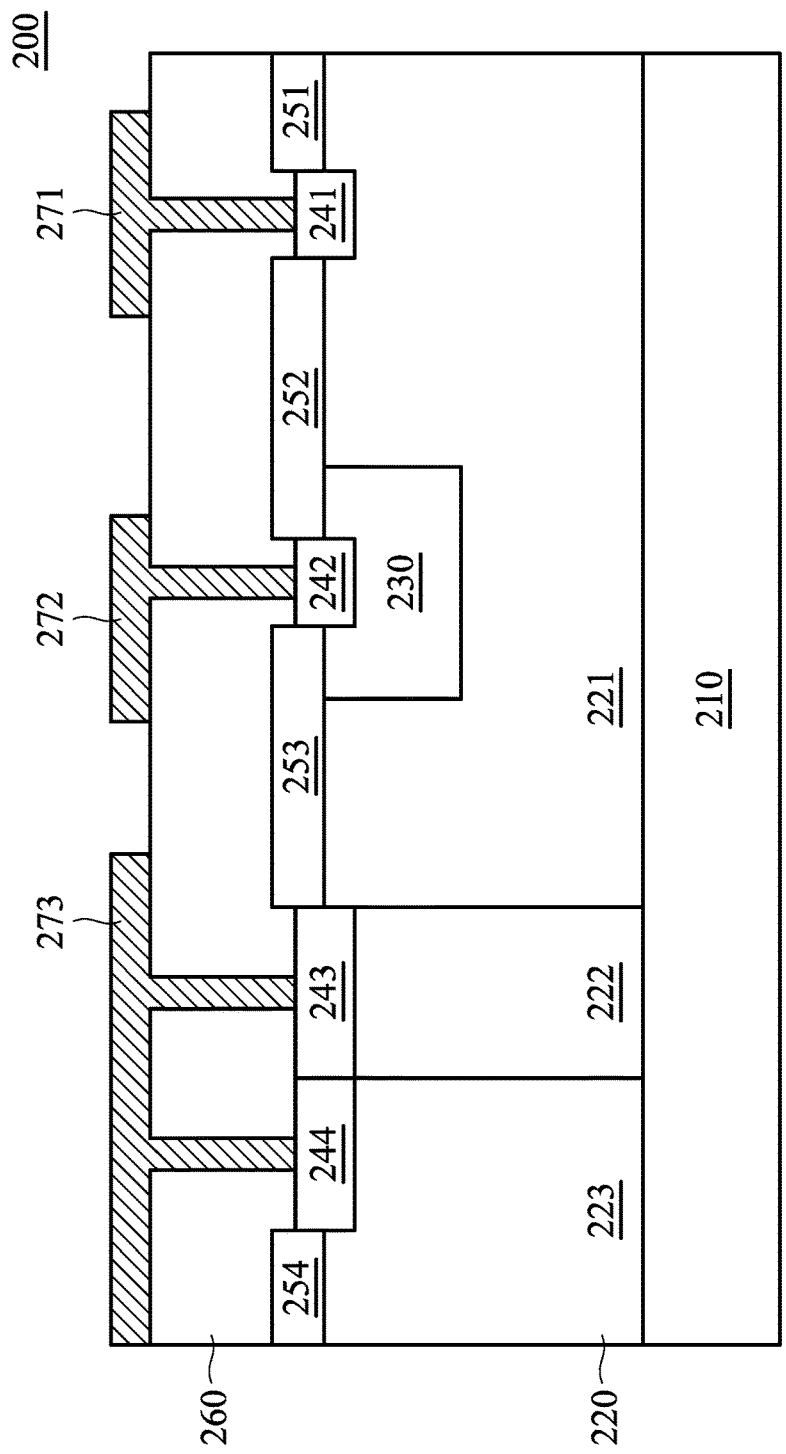
FIG. 2 is a schematic diagram of another exemplary embodiment of a semiconductor device, according to various aspects of the present disclosure.

FIG. 2 is a schematic diagram of another exemplary embodiment of a semiconductor device, according to various aspects of the present disclosure. FIG. 2 is similar to FIG. 1 with the exception that the well 220 comprises regions 221~223. In this embodiment, the concentration of the dopants in the region 222 is lower than the concentration of the dopants in the region 221 or 223. In one embodiment, the concentration of the dopants in the region 221 is about equal to the concentration of the dopants in the region 223.

In the present disclosure, the method for forming the region 222 is not limited. In one embodiment, the predetermined regions for the regions 221 and 223 may be implanted with dopants and no dopant is implanted in the predetermined region for the region 222. In this case, the dopants in the regions 221 and 223 may be diffused into the region 222. Therefore, the region 222 has the dopants. The conductivity type of the dopants in the region 222 is the same as the conductivity type of the dopants in the region 221 or 223. In one embodiment, the region 222 has the second conductivity type. However, the concentration of the dopants in the region 222 is lower than the concentration of the dopants in the region 221 or 223.

In another embodiment, a first doping process is performed in the predetermined regions for the regions 221 and 223, and a second doping process is performed in the predetermined region 222. The concentration of the dopants doped in the region 222 is lower than the concentration of the dopants doped in the region 221.

Since the features of the semiconductor substrate 210, the well 230, the doped regions 241~244, the insulating structures 251~254, the insulating layer 260 and the interconnection structures 271~273 shown in FIG. 2 are the same as the features of the semiconductor substrate 110, the well 130, the doped regions 141~144, the insulating structures 151~154, the insulating layer 160 and the interconnection structures 171~173 shown in FIG. 1, the descriptions relating to the semiconductor substrate 210, the well 230, the doped regions 241~244, the insulating structures 251~254, the insulating layer 260 and the interconnection structures 271~273 shown in FIG. 2 are omitted.

Figure 3:
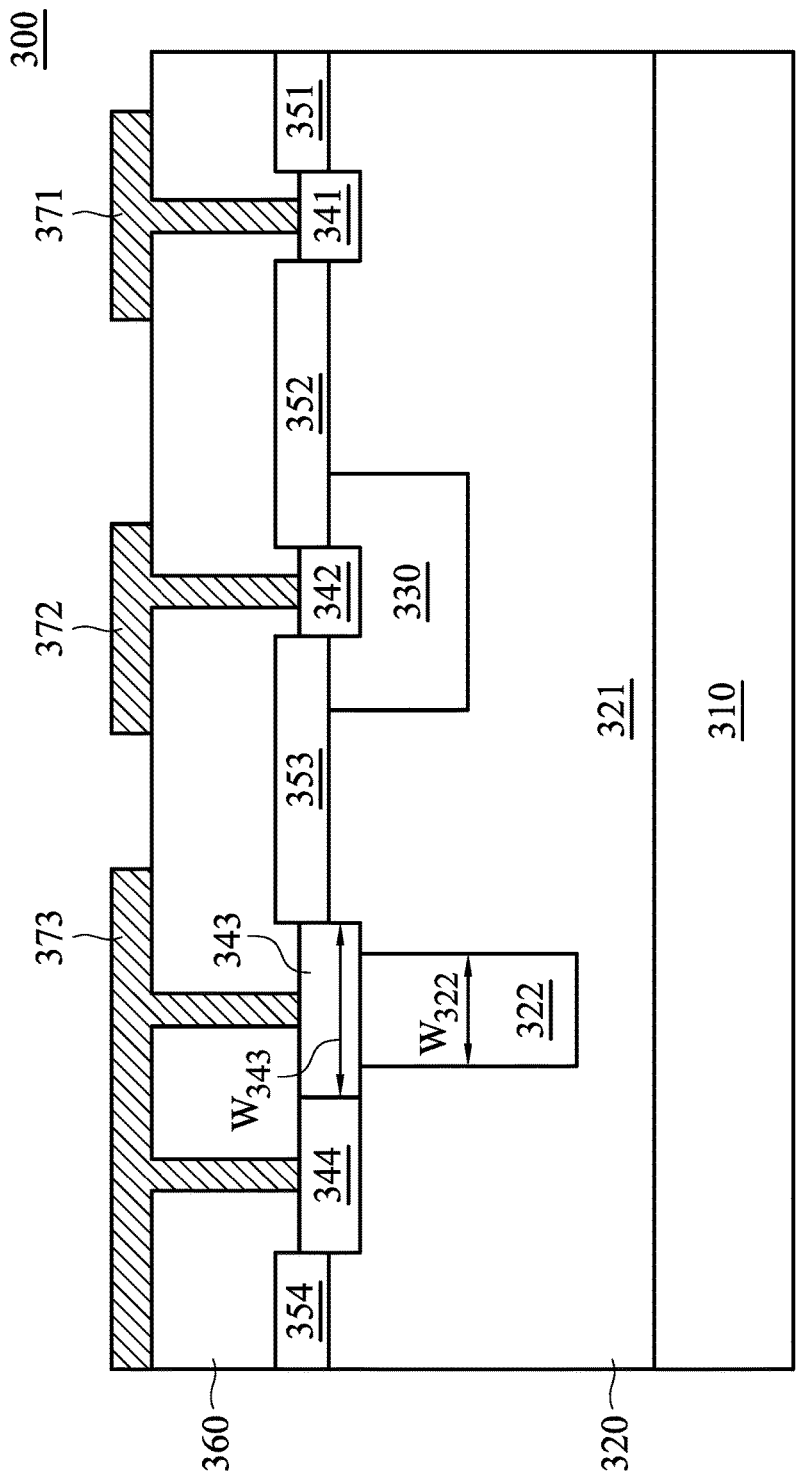
FIG. 3 is a schematic diagram of another exemplary embodiment of a semiconductor device, according to various aspects of the present disclosure.

FIG. 3 is a schematic diagram of another exemplary embodiment of a semiconductor device, according to various aspects of the present disclosure. FIG. 3 is similar to FIG. 1 with the exception that the width $W_{322}$ of the region 322 is less than the width $W_{343}$ of the doped region 343 shown in FIG. 3. The doped region 343 overlaps a portion of the region 321. In this embodiment, the conductivity type of the doped region 343 is different than the conductivity type of the region 322. Additionally, the conductivity type of the region 321 is the same as the conductivity type of the region 322. However, the concentration of the dopants in the region 321 is lower than the concentration of the dopants in the region 322.

Since the features of the semiconductor substrate 310, the wells 320 and 330, the doped regions 341~344, the insulating structures 351~354, the insulating layer 360 and the interconnection structures 371~373 shown in FIG. 3 are the same as the features of the semiconductor substrate 110, the wells 120 and 13, the doped regions 141~144, the insulating structures 151~154, the insulating layer 160 and the interconnection structures 171~173 shown in FIG. 1, the descriptions of the semiconductor substrate 310, the wells 320 and 330, the doped regions 341~344, the insulating structures 351~354, the insulating layer 360 and the interconnection structures 371~373 are omitted.

Figure 4A:
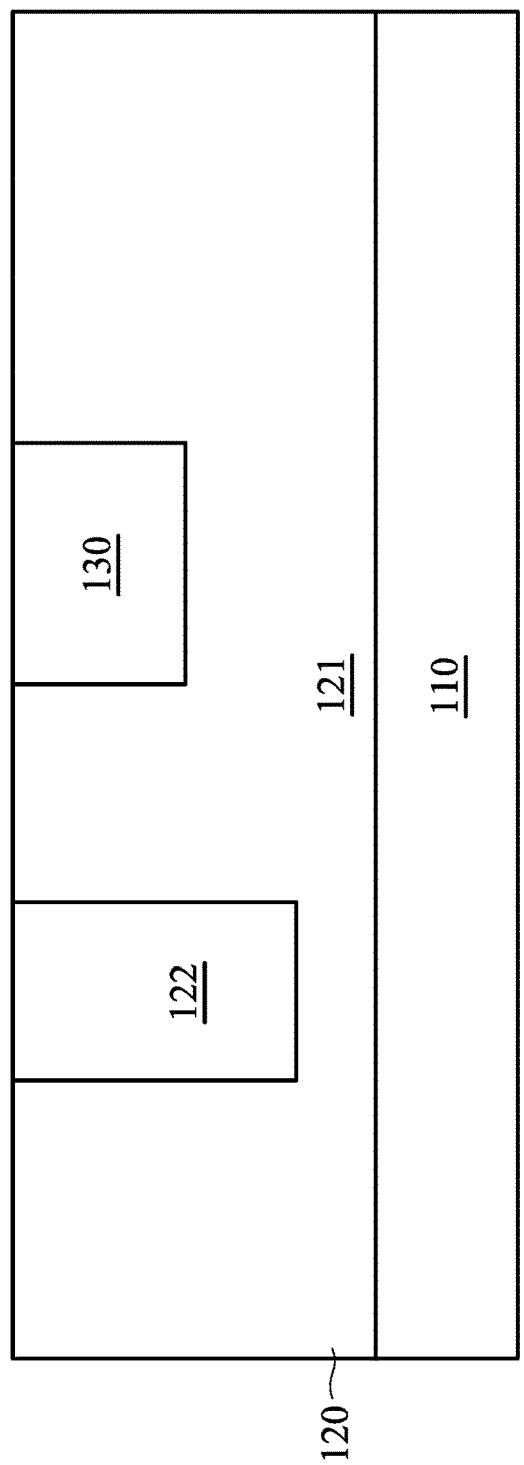
FIGS. 4A-4D are cross-sectional views of the semiconductor device at various manufacturing stages in accordance with some embodiments of the present disclosure.

FIGS. 4A~4D are cross sections of an exemplary embodiment of a method for fabricating a semiconductor device according to the invention. Referring to FIG. 4A, a semiconductor substrate 110, such as a silicon substrate or another suitable semiconductor substrate, is provided. In another embodiment, the semiconductor substrate 110 may be a lightly doped substrate such as a lightly doped P-type substrate or a lightly doped N-type substrate. In this embodiment, the semiconductor substrate 110 has a first conductivity type.

Next, a well 120 is formed in a predetermined region of the semiconductor substrate 110 sequentially by a doping process (e.g., ion implantation), and a thermal diffusion process. The well 120 has a second conductivity type. In this embodiment, the well 120 comprises regions 121 and 122. The concentration of the dopants in the region 121 is higher than the concentration of the dopants in the region 122. In one embodiment, no dopant is doped in the region 122. However, a doping process is executed for the region 121. Since the dopants doped in the region 121 may be diffused to the region 122, the conductivity type of the dopants in the region 121 and the conductivity type of the dopants in the region 122 are the second conductivity type. In another embodiment, a first doping process is executed for the region 121, and a second doping process is executed for the region 122, wherein the concentration of the dopants doped in the region 121 is higher than the concentration of the dopants doped in the region 122. In some embodiments, the region 122 is formed in the region 121.

Next, a well 130 is formed in a predetermined region of the well 120 sequentially by a doping process (e.g., ion implantation), and a thermal diffusion process. In one embodiment, the well 130 has the first conductivity type. In other embodiments, the dopant concentration of the well 130 is higher than the dopant concentration of the semiconductor substrate 110.

Figure 4B:
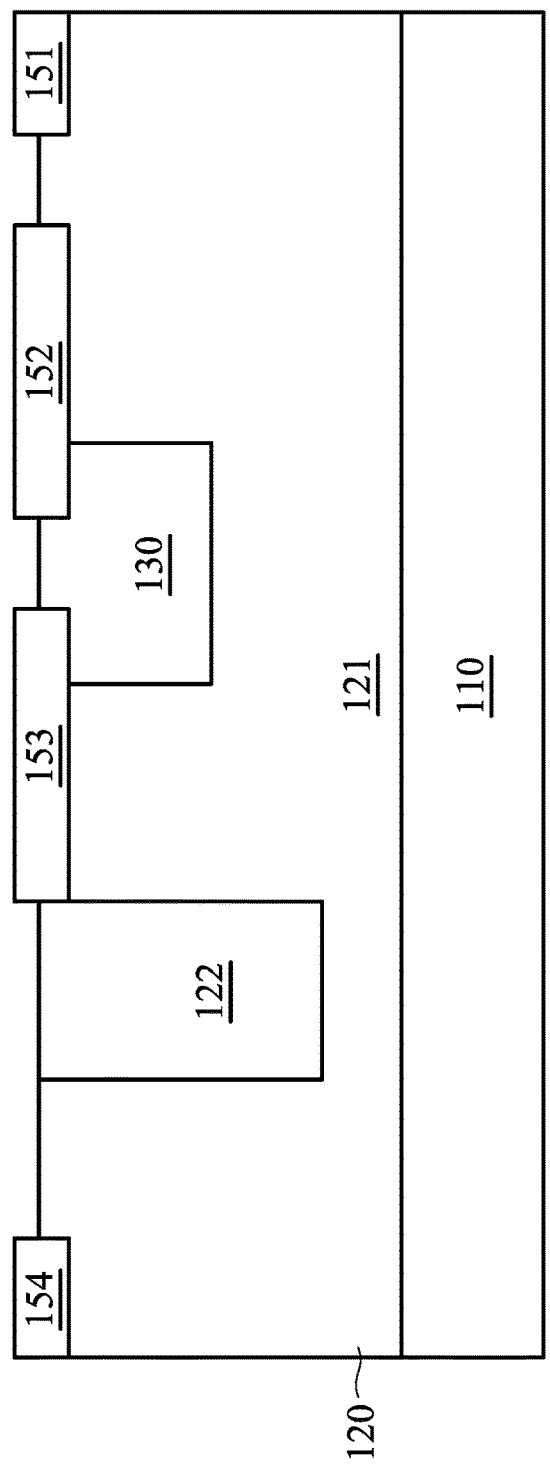

Referring to FIG. 4B, insulating structures 151~154 are formed on the semiconductor substrate 110. The insulating structure 151 is extended into the region 121. The insulating structure 152 is extended into the region 121 and the well 130. In this embodiment, a predetermined region for the doped region 141 is limited by the insulating structures 151 and 152. The insulating structure 153 is extended into the well 130 and the region 121. A predetermined region for the doped region 142 is limited by the insulating structures 152 and 153. A predetermined region for the doped region 143 and a predetermined region for the doped region 144 are limited by the insulating structures 153 and 154. The insulating structure 154 is extended into the region 121.

Figure 4C:
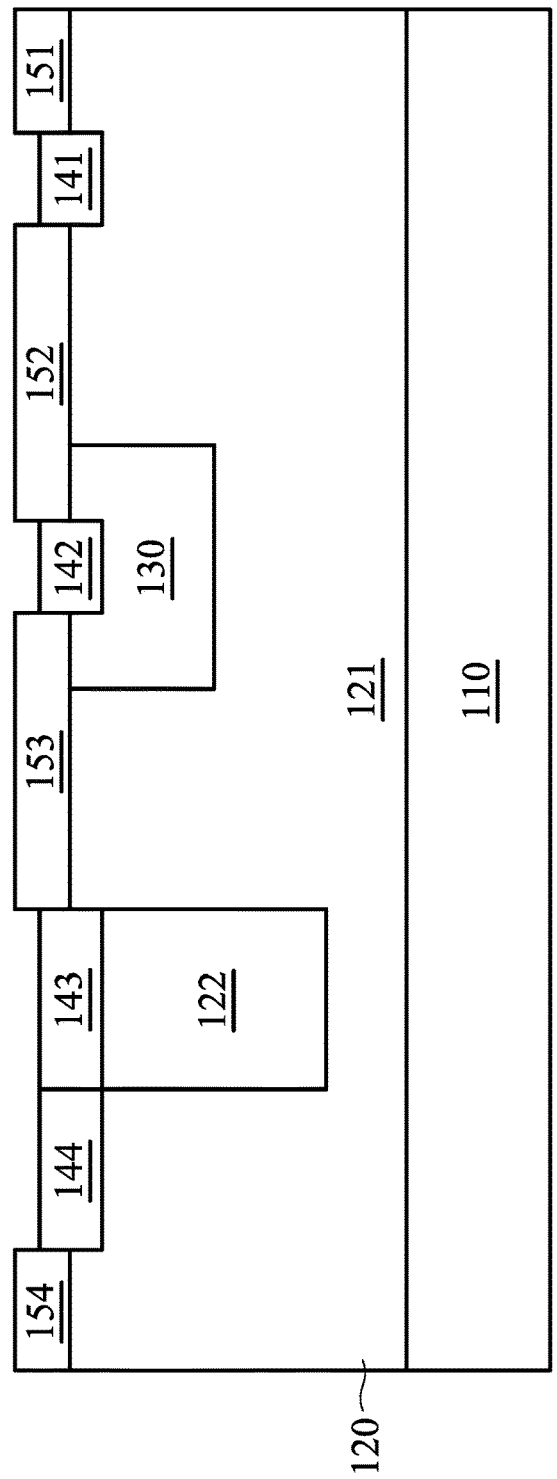

Referring to FIG. 4C, the doped regions 141~144 are formed by a doped process (e.g. ion implantation). In this embodiment, the doped region 141 is formed in the region 121 and disposed between the insulating structures 151 and 152. The doped region 142 is formed in the well 130 and disposed between the insulating structures 152 and 153. In this embodiment, the doped region 142 is disposed between the doped regions 141 and 143.

The doped region 143 is formed in the region 122. As shown in FIG. 4C, the doped region 143 is disposed between the doped regions 142 and 144. In this embodiment, the doped region 143 covers the region 122, but the disclosure is not limited thereto. In other embodiments, the doped region 143 further covers a portion of the region 121. In some embodiments, the doped region 143 overlaps a portion of the region 122. The doped region 144 is formed in the region 121 and is disposed between the insulating structure 154 and the doped region 143. In this embodiment, the doped region 144 directly contacts the doped region 143, but the disclosure is not limited thereto. In other embodiments, the doped region 144 is spaced apart from the doped region 143. In one embodiment, each of the doped regions 141 and 144 has the second conductivity type, and each of the doped regions 142 and 143 has the first conductivity type.

Figure 4D:
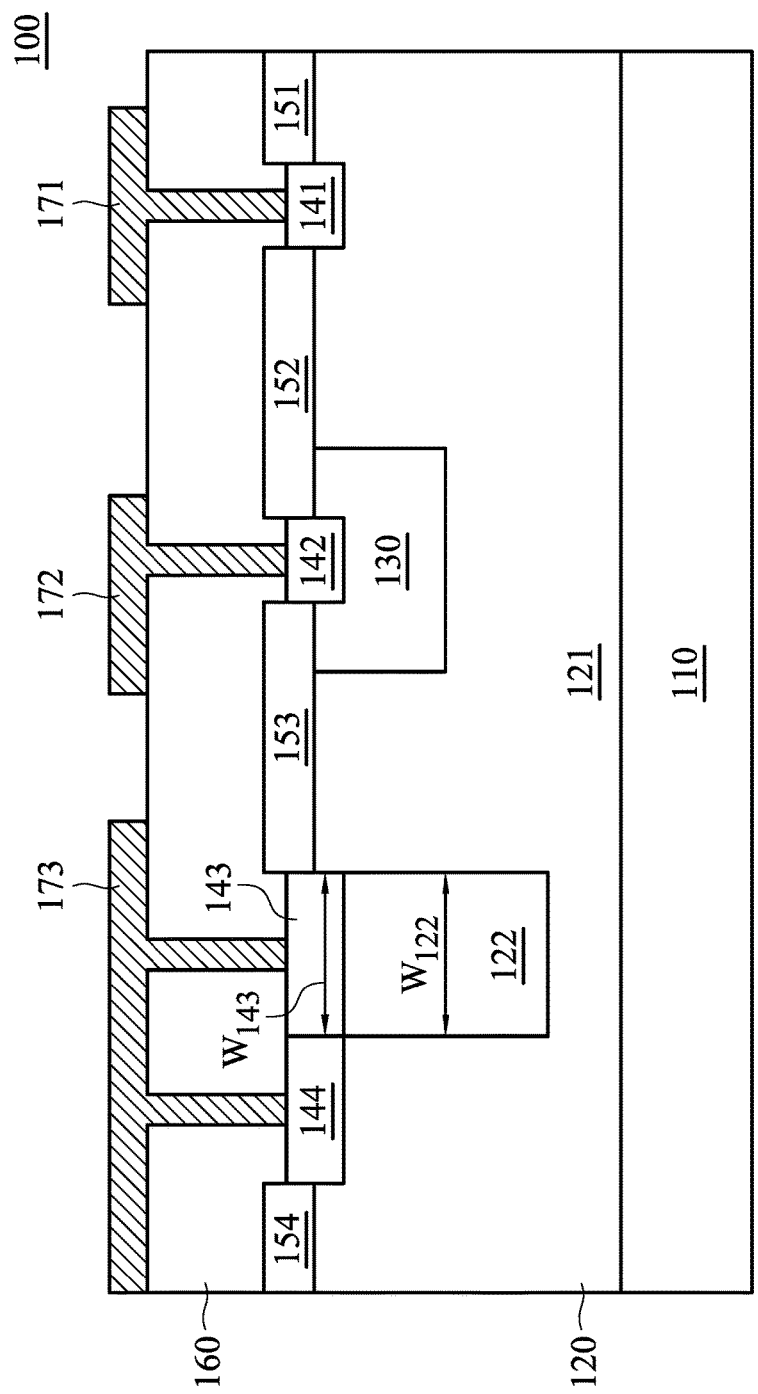

Referring to FIG. 4D, an insulating layer 160 is formed on the insulating structures 151~154 and the doped regions 141~144. Next, interconnection structures 171~173 are formed on the insulating layer 160 by a metallization process. The interconnection structure 171 is electrically connected to the doped region 141 to serve as a source electrode of a JFET. The interconnection structure 172 is electrically connected to the doped region 142 to serve as a gate electrode of the JFET. The interconnection structure 173 is electrically connected to the doped regions 143 and 144 to serve as a drain electrode of the JFET. As a result, the fabrication of the semiconductor device 100 is completed.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure, comprising:
    a semiconductor substrate having a first conductivity type;
    a first well formed in the semiconductor substrate and having a second conductivity type, wherein the first well comprises a first region and a second region, a dopant concentration of the first region is higher than a dopant concentration of the second region;
    a second well having the first conductivity type and formed in the first region;
    a first doped region having the second conductivity type and formed in the first region, wherein the second conductivity type is different than the first conductivity type;
    a second doped region having the first conductivity type and formed in the second well;
    a third doped region having the first conductivity type and formed in the second region; and
    a fourth doped region having the second conductivity type and formed in the first region.

2. The semiconductor structure as claimed in claim 1, wherein the third doped region completely covers the second region.

3. The semiconductor structure as claimed in claim 1, wherein the third doped region covers a portion of the first region.

4. The semiconductor structure as claimed in claim 1, wherein the second doped region is disposed between the first and third doped regions.

5. The semiconductor structure as claimed in claim 4, wherein the third doped region is disposed between the second and fourth doped regions.

6. The semiconductor structure as claimed in claim 1, wherein the third doped region is in direct contact with the fourth doped region.

7. The semiconductor structure as claimed in claim 1, further comprising:
    a first interconnection structure electrically connected to the first doped region;
    a second interconnection structure electrically connected to the second doped region;
    a third interconnection structure electrically connected to the third and fourth doped regions, wherein the first interconnection structure serves as a source of a junction field effect transistor (JFET), the second interconnection structure serves as a gate of the JFET, and the third interconnection structure serves as a drain of the JFET.

8. The semiconductor structure as claimed in claim 1, wherein the first conductivity type is P-type, and the second conductivity type is N-type.

9. The semiconductor structure as claimed in claim 1, wherein the first conductivity type is N-type, and the second conductivity type is P-type.

10. The semiconductor structure as claimed in claim 1, wherein the second region is disposed within the first region.

11. A method for manufacturing a semiconductor structure, comprising:
    providing a semiconductor substrate with a first conductivity type;
    forming a first well in the semiconductor substrate, wherein the first well has a second conductivity type;
    forming a first region in the first well, wherein the first region has the first conductivity type;
    forming a second region in the first well, wherein the second region has the first conductivity type, and a dopant concentration of the first region is higher than a dopant concentration of the second region;
    forming a second well in the first region, wherein the second well has the first conductivity type;
    forming a first doped region in the first region, wherein the first doped region has the second conductivity type that is different than the first conductivity type;
    forming a second doped region in the second well, wherein the second doped region has the first conductivity type;
    forming a third doped region in the second region, wherein the third doped region has the first conductivity type; and
    forming a fourth doped region in the first region, wherein the fourth doped region has the second conductivity type.

12. The method as claimed in claim 11, wherein the third doped region completely covers the second region.

13. The method as claimed in claim 11, wherein the third doped region covers a portion of the first region.

14. The method as claimed in claim 11, wherein the second doped region is disposed between the first and third doped regions.

15. The method as claimed in claim 14, wherein the third doped region is disposed between the second and fourth doped regions.

16. The method as claimed in claim 11, wherein the third doped region is in direct contact with the fourth doped region.

17. The method as claimed in claim 11, further comprising:
    forming a first interconnection structure, wherein the first interconnection structure is electrically connected to the first doped region to serve as a source of a JFET;
    forming a second interconnection structure, wherein the second interconnection structure is electrically connected to the second doped region to serve as a gate of the JFET; and
    forming a third interconnection structure, wherein the third interconnection structure is electrically connected to the third and the fourth doped regions to serve as a drain of the JFET.

18. The method as claimed in claim 11, wherein the first conductivity type is P-type, and the second conductivity type is N-type.

19. The method as claimed in claim 11, wherein the first conductivity type is N-type, and the second conductivity type is P-type.

20. The method as claimed in claim 11, wherein the second region is formed in the first region.

* * * * *